US008434374B2

(12) United States Patent
Bhat et al.

(10) Patent No.: US 8,434,374 B2
(45) Date of Patent: May 7, 2013

(54) SUB-THRESHOLD FORCED PLATE FET SENSOR FOR SENSING INERTIAL DISPLACEMENTS, A METHOD AND SYSTEM THEREOF

(75) Inventors: Navakanta Bhat, Karnataka (IN); Rudra Pratap, Karnataka (IN); Thejas, Karnataka (IN)

(73) Assignee: Indian Institute of Science, Bangalore, Karnataka (IN)

( * ) Notice: Subject to any disclaimer, the term of this patent is extended or adjusted under 35 U.S.C. 154(b) by 335 days.

(21) Appl. No.: 12/937,023

(22) PCT Filed: Jun. 19, 2008

(86) PCT No.: PCT/IN2008/000386
§ 371 (c)(1),
(2), (4) Date: Oct. 8, 2010

(87) PCT Pub. No.: WO2009/125422
PCT Pub. Date: Oct. 15, 2009

(65) Prior Publication Data
US 2011/0050201 A1    Mar. 3, 2011

(30) Foreign Application Priority Data
Apr. 11, 2008    (IN) .............................. 907/CHE/2008

(51) Int. Cl.
*G01L 1/12*    (2006.01)
(52) U.S. Cl.
USPC ...................................... 73/862.626; 73/777

(58) Field of Classification Search .................... 73/760, 73/777, 862.626
See application file for complete search history.

(56) References Cited

U.S. PATENT DOCUMENTS

| 4,873,871 | A | 10/1989 | Bai et al. | |
|---|---|---|---|---|
| 5,700,702 | A * | 12/1997 | Klose et al. | 438/48 |
| 7,516,660 | B2 * | 4/2009 | Kozlov et al. | 73/514.16 |
| 7,750,462 | B1 * | 7/2010 | Cohn et al. | 257/704 |
| 2003/0015766 | A1 * | 1/2003 | Abbott et al. | 257/510 |
| 2004/0119125 | A1 * | 6/2004 | Gogoi et al. | 257/414 |

FOREIGN PATENT DOCUMENTS

| DE | 3635462 A1 | 4/1987 |
|---|---|---|
| DE | 4031369 A1 | 4/1992 |
| DE | 602005001245 T2 | 1/2008 |
| JP | 5187942 A | 7/1993 |
| JP | 10070287 A | 3/1998 |

* cited by examiner

*Primary Examiner* — Max Noori
(74) *Attorney, Agent, or Firm* — Harness, Dickey & Pierce, PLC

(57) ABSTRACT

The present invention relates to a Sub-threshold Field Effect Transistor (SF-FET). The invention integrates a MEMS mechanical transducer along with the sensing mechanism in a single device. Forced mass is capacitively coupled onto the FET structure. Dielectric $SiO_2$ forms good interface with underlying silicon substrate. Air dielectric forms second dielectric wherein effective gate capacitance is the series combination of the second dielectric capacitance and fixed dielectric. Inertial displacements are sensed by observing change in drain current ($I_D$) of the sensor due to change in gap height ($T_{Gap}$) of the second dielectric of the sensor caused by forced mass.

24 Claims, 3 Drawing Sheets

US 8,434,374 B2

SUB-THRESHOLD FORCED PLATE FET SENSOR FOR SENSING INERTIAL DISPLACEMENTS, A METHOD AND SYSTEM THEREOF

FIELD OF THE INVENTION

The present invention relates to the domain of forced mass MEMS sensors, more particularly relates to class of forced plate sensors under MEMS/NEMS category which can be capacitively coupled onto the Field Effect Transistor (FET).

BACKGROUND OF THE INVENTION

Forced plate sensing scheme is widely used in most MEMS applications such as gyroscopes, accelerometers, vibrometers, etc. MEMS micro-g accelerometers for example are in great demand in seismology, military applications etc. MEMS gyroscopes find their applications in GPS and RADAR aided navigation, anti rollover systems, electronic stability control systems and the like.

Inertial grade gyroscopes are in demand at present for space applications since an angular drift of ~0.001 deg/sec has to be picked up to estimate and correct the drift incase of satellites and GPS guided devices. The present state-of-the-art is mostly based on integrating a MEMS Gyroscope to a highly sensitive capacitance detection circuitry to pick-up changes as low as a few femto-farads in case of rate/tactical Gyros or to pick up capacitance changes in a few atto-farads as in case of inertial grade gyros. The limitation as such is not from the mechanical response of the MEMS Gyro design but from the significant challenges in the electronic sensing circuitry which needs to cater to a reasonable amplification factor while offering very low coupling in terms of parasitic and noise pick-up. Same is the case with milli-g, micro-g sensing accelerometers, vibrometers and the like.

Force sensing is needed in inertial systems to detect acceleration, vibration and angular rate which induce some or the other kind of inertial force (e.g., direct inertial term in accelerometers and coriolis force in gyroscopes). Typically these forces are extremely small and the motion caused by them is what is sensed by these sensors. These motions are in general, rigid body motion of the proof mass leading to a uniformly displacement field that needs to be sensed.

Among the solutions that have been proposed to enhance the sensitivity of force sensors, the following are the most widely used. Sensing based on tunneling concept has been proposed [1], where a Nickel cantilever beam is located above a tunneling tip and tunneling transduction mechanism is used to enhance the sensitivity of the device. A proposal based on magnetic actuation and detection [2] claims a resolution of 0.005°/s, a bandwidth of 70 Hz and a noise floor of <0.5°/s in a 65 Hz bandwidth. The proposal of a novel gyro design which makes use of levitation by electrostatic forces and with no mechanical connection to the substrate is also reported with claims of high sensitivity and dynamically adjustable bandwidth [3]. Built-in amplification by coupling the proof mass of an inertial device as the gate of the FET and exploiting the linear relationship between the gate displacement and the drain current is explored in reference [6].

Limitations in Prior Art:

1. The electronics interface for the model described in [1] requires a complex circuitry involving two servo control loops to maintain a constant oscillation amplitude in the horizontal direction and to maintain a constant tunneling current in the vertical direction. The device has the potential of catering to a rate grade specifications and not beyond.

2. The principle of magnetic actuation and detection employed in [2] is not compatible with standard MEMS and CMOS processing. Also the miniaturization of magnetic actuation is challenging.

3. The control system of the electro statically levitated design [3] comprises of a multi-mode sigma-delta modulator which prove to be a significant overhead in terms of device integration. The feasibility of this principle in forced mass MEMS sensor models and its actual sensitivity when integrated is not yet known.

4. The prevalent way of characterizing small deflection measurements based on differential capacitance sensing ($\Delta C$~femto or atto farads) requires a complex front-end signal conditioning circuitry [5] and the resolution gets limited by the noise floor of the electronics circuitry [4].

5. Since the FET is biased in saturation regime [6] the drain current is a linear function of in-the plane gate displacement. However this sensing scheme does not offer high amplification factors for displacements of the order of pico-meters.

OBJECTS OF THE INVENTION

The principal object of the present invention is to develop a Sub-threshold Forced plate FET (SF-FET) sensor for sensing inertial displacements Another object of the invention is to develop a forced mass forming a suspended gate of the sensor.

Still another object of the invention is to develop a fixed dielectric medium on substrate of the FET Still another object of the invention is to develop a second dielectric medium formed between the forced mass and the fixed dielectric, wherein alteration in gap height ($T_{Gap}$) due to the inertial displacements on the forced mass varies sensor gate capacitance.

Still another object of the invention is to provide for a method to sense inertial displacements using Sub-threshold Forced plate FET (SF-FET) sensor comprises act of observing change in drain current ($I_D$) of the sensor due to change in gap height ($T_{Gap}$) of the second dielectric of the sensor caused by forced mass for sensing the inertial displacements.

Still another object of the invention is to develop a system for sensing deflections due to forced displacement Still another object of the invention is to develop a forced mass or plate forming a suspended gate of the sensor, fixed dielectric on substrate of the FET, and a second dielectric formed between the forced mass and the fixed dielectric, wherein alteration in gap height ($T_{Gap}$) of second dielectric due to the forced displacement on the mass/plate coupled varies the sensor gate capacitance.

Still another object of the invention is to develop a means to operate the sensor at sub-threshold region by applying constant gate-to-source voltage ($V_{GS}$), wherein the voltage ($V_{Gs}$) is less than the threshold voltage ($V_T$) of the sensor.

Still another object of the invention is to develop a means to sense the exponential change in drain current ($I_D$) due to the variation in sensor gate capacitance for sensing the deflection.

STATEMENT OF THE INVENTION

Accordingly the invention provides for a Sub-threshold Forced plate FET (SF-FET) sensor for sensing inertial displacements comprises: forced mass forming a suspended gate of the sensor, fixed dielectric medium on substrate of the FET, and a second dielectric medium formed between the forced mass and the fixed dielectric, wherein the inertial displacements deflects suspended forced mass of the sensor resulting in change in gap height ($T_{Gap}$) of the second dielectric which in turn varies sensor gate capacitance; also provides for a method to sense inertial displacements using Sub-threshold Forced plate FET (SF-FET) sensor comprises act of observing change in drain current ($I_D$) of the sensor due to change in gap height ($T_{Gap}$) of the second dielectric of the sensor caused by deflection of suspended forced mass for sensing the inertial displacements; and is also provides for a system for sensing deflections due to forced displacement comprising: a forced mass or plate forming a suspended gate of the sensor, fixed dielectric on substrate of the FET, and a second dielectric formed between the forced mass and the fixed dielectric, wherein the inertial displacements deflects suspended forced mass of the sensor resulting in change in gap height ($T_{Gap}$) of second dielectric which in turn varies the sensor gate capacitance, a means to operate the sensor at sub-threshold region by applying constant gate-to-source voltage ($V_{GS}$), wherein the voltage ($V_{GS}$) is less than the threshold voltage ($V_T$) of the sensor, and a means to sense the exponential change in drain current ($I_D$) due to the variation in sensor gate capacitance for sensing the deflection.

BRIEF DESCRIPTION OF THE ACCOMPANYING DRAWINGS

DETAILED DESCRIPTION OF THE INVENTION

Figure 1:
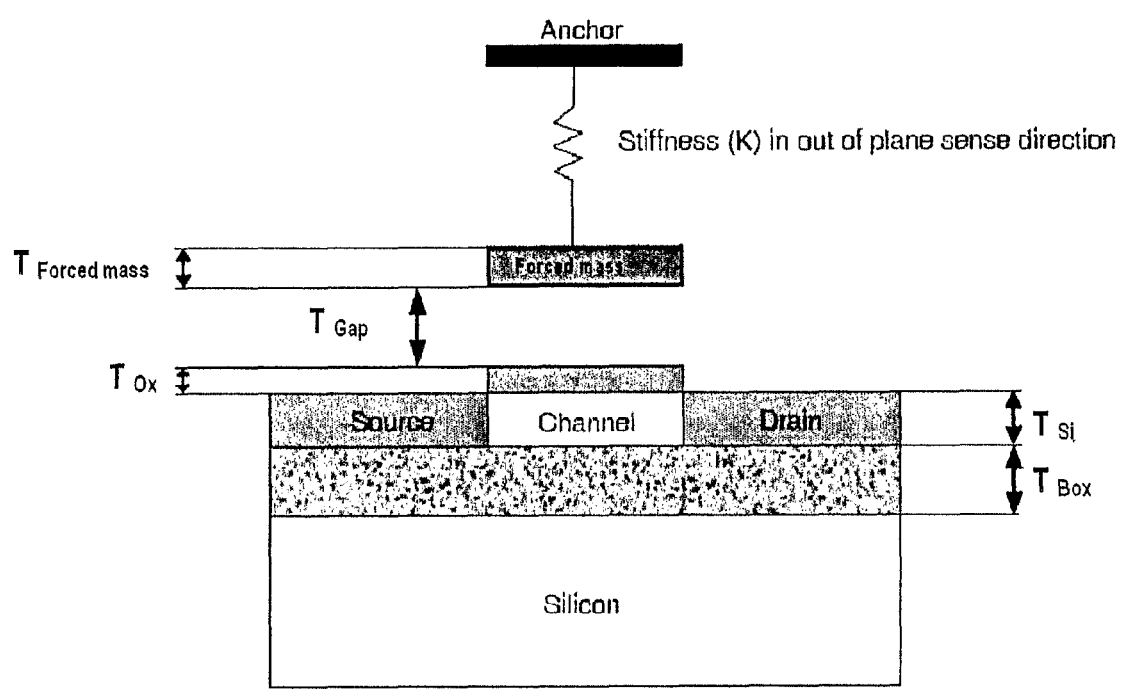
FIG. 1 shows the Cross sectional view of the sensor device.

The present invention is in relation to a Sub-threshold Forced plate FET (SF-FET) sensor for sensing inertial displacements comprises: forced mass forming a suspended gate of the sensor, fixed dielectric medium on substrate of the FET, and a second dielectric medium formed between the forced mass and the fixed dielectric, wherein the inertial displacements deflects suspended forced mass of the sensor resulting in change in gap height ($T_{Gap}$) of the second dielectric which in turn varies sensor gate capacitance.

In yet another embodiment of the present invention the fixed dielectric is preferably silicon-dioxide ($SiO_2$) formed on top of FET channel.

In still another embodiment of the present invention the fixed dielectric is selected from a group of dielectric materials comprising Silicon dioxide ($SiO_2$), high-K material and other dielectric material to act as a passivating layer for the substrate under choice.

In still another embodiment of the present invention forced plate is proof mass of MEMS/NEMS transducer.

In still another embodiment of the present invention said second dielectric medium allows forced plate to exhibit at least a single degree of freedom motion to constitute the SF-FET.

In still another embodiment of the present invention the forced plate realm extends beyond and spans whole category of any rigid plate design.

In still another embodiment of the present invention the forced mass is displaced by inertial displacements altering the gap height ($T_{Gap}$) of the second dielectric, wherein linear change in forced mass displacement results in an exponential change in drain current ($I_D$) of the sensor.

In still another embodiment of the present invention the gap height ($T_{Gap}$) of second dielectric is optimized for predetermined thickness of silicon dioxide layer ($T_{Ox}$) and predetermined thickness of silicon substrate layer ($T_{Si}$) for enhanced capacitive coupling and to obtain low threshold voltage requirements.

In still another embodiment of the present invention the sensor is built on a Silicon-On-Insulator (SOI) substrate comprising of a thin film of Silicon (Si) resting on an oxide layer which is buried in the Silicon (Si) substrate.

In still another embodiment of the present invention the substrate is selected from a group of semi-conducting material comprising Germanium, Silicon (Si) and Gallium arsenide (GaAs).

In still another embodiment of the present invention the sensor is integrated into a standard CMOS-MEMS process flow on a single silicon substrate.

In still another embodiment of the present invention said sensor has feed back control loop for maintaining constant drain current ($I_D$), enhancing the dynamic range of the SF-FET and for maintaining uniform sensitivity over a wide range of operations.

In still another embodiment of the present invention the sensor is implemented with poly-silicon gate and diffused source-drain junctions or with metal gates and schottky source-drain junctions or any combinations thereof.

In still another embodiment of the present invention the SF-FET is operated in fully depleted SOI (Silicon on Insulator) mode and sub-threshold slope of the SF-FET is enhanced due to fully depleted SOI architecture, which further improves overall sensitivity of the SF-FET.

In still another embodiment of the present invention the fully depleted SOI mode is configured to give predetermined sensitivity, SF-FET is also implemented in Partially Depleted SOI (PDSOI), Dynamically Depleted SOI (DDSOI), bulk MOSFET or other similar device structure.

In still another embodiment of the present invention the sensor has predetermined amplification factor which is obtained by biasing the SF-FET in the sub-threshold regime and enables amplification of displacements of the order of nano/pico meter, due to the forced plate motion.

In still another embodiment of the present invention the forced mass is subjected to angular rigid body motion.

In still another embodiment of the present invention the forced mass is realized using a plate or rod pivoted at the center.

Another main embodiment of the present invention is a method to sense inertial displacements using Sub-threshold Forced plate FET (SF-FET) sensor comprises act of observing change in drain current ($I_D$) of the sensor due to change in gap height ($T_{Gap}$) of the second dielectric of the sensor caused by deflection of suspended forced mass for sensing the inertial displacements.

In still another embodiment of the present invention said sensor is operated by applying constant gate-to-source voltage ($V_{GS}$), which is less than threshold voltage ($V_T$) of the FET.

In still another embodiment of the present invention the change in the gap height ($T_{Gap}$) of the second dielectric results in change in sensor gate capacitance.

In still another embodiment of the present invention the change in sensor gate capacitance results in exponential change in the drain current ($I_D$).

In still another embodiment of the present invention the inertial displacements are generated from vibrometers, accelerometers, gyroscopes, chemical vapor sensors and other forced plate motion which is a candidate for small deflection measurement.

The present invention is in relation to a system for sensing deflections due to forced displacement comprising: a forced mass or plate forming a suspended gate of the sensor, fixed dielectric on substrate of the FET, and a second dielectric formed between the forced mass and the fixed dielectric, wherein the inertial displacements deflects suspended forced mass of the sensor resulting in change in gap height ($T_{Gap}$) of second dielectric which in turn varies the sensor gate capacitance, a means to operate the sensor at sub-threshold region by applying constant gate-to-source voltage ($V_{GS}$), wherein the voltage ($V_{GS}$) is less than the threshold voltage ($V_T$) of the sensor, and a means to sense the exponential change in drain current ($I_D$) due to the variation in sensor gate capacitance for sensing the deflection.

The proposed solution integrates a MEMS mechanical transducer along with the sensing mechanism (a FET that produces current as the sense output) in a single device structure. The single device structure eliminates the need for a separate front-end signal conditioning circuitry [7] [8] besides offering a high sensitivity. The forced mass is capacitively coupled onto the Field Effect Transistor (FET) structure. The FET consisting of a stack of two dielectrics is used as the inertial sensing device.

FIG. 1 shows the cross-sectional view of the device. The fixed dielectric is $SiO_2$ which forms a good interface with the underlying Silicon substrate. However, other dielectric (high-K or otherwise) that gives a good interface with silicon is used. The second dielectric in this case is formed by the air gap. However, this dielectric is not limited to air gap alone. The choice of second dielectric is application specific.

The effective gate capacitance is the series combination of the second dielectric capacitance $C_{Gap}$ and fixed dielectric capacitance ($C_{Ox}$). The thickness of oxide layer ($T_{Ox}$) is made much smaller compared to the thickness of the dielectric gap ($T_{Gap}$) so that the effective gate capacitance is dominated by the capacitance of the gap ($T_{Gap}$). The forced mass (which is coupled as Gate of MOSFET) in the proposed structure is biased such that the Field Effect Transistor (FET) is in the sub-threshold region where the drain current ($I_D$) varies exponentially with the gate-to-source voltage ($V_{GS}$). The device is operated by applying a constant $V_{GS}$, which is less than the threshold voltage ($V_T$) of the transistor. The drain current ($I_D$) forms the sensor response. For an induced forced mass displacement, the forced mass moves perpendicular to the FET channel as shown in FIG. 1. This displacement of the forced mass induces a change in the threshold of the MOS device and hence an exponential change in the drain current ($I_D$).

The device is constructed on a Silicon-On-Insulator (SOI) substrate with silicon film thickness $T_{Si}$ and buried oxide thickness $T_{Box}$. The threshold voltage $V_T$ of the device is adjusted by controlling the substrate doping concentration $N_A$, $T_{Si}$, $T_{Gap}$ and $T_{Ox}$. When $T_{Si}$ is smaller than the depletion width (fully depleted SOI), the effective silicon depletion capacitance goes down in the SOI structure, which enhances the sub-threshold slope of the transistor, enabling the sensor to achieve even higher degree of sensitivity.

Figure 2:
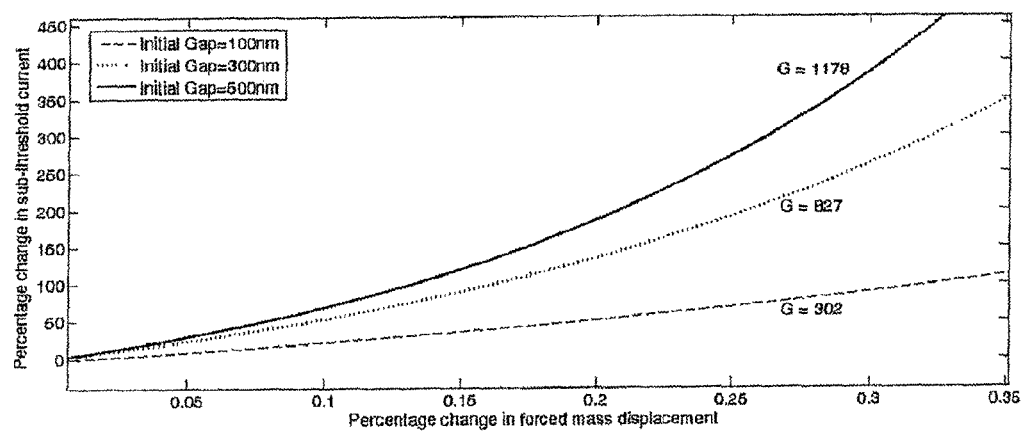
FIG. 2 shows graph of sensitivity of the device when operated in sub-threshold regime.

FIG. 2 shows the response of the proposed SF-FET. In conventional techniques, the sensitivity is limited by the ability to sense the linear displacement in the proof mass using techniques such as capacitive sensing [4]. However, in the present SF-FET, the linear displacement of the proof mass is directly converted into an exponential change in the drain current ($I_D$). The intrinsic gain of the sensor is defined as the percentage change in drain current ($I_D$) to the percentage change in the linear displacement.

As shown in FIG. 2, the proposed device gives a sensing gain in the range of 302 to 1178 for a 0.1% change in forced mass displacement, corresponding to the initial gap of choice.

Figure 3:
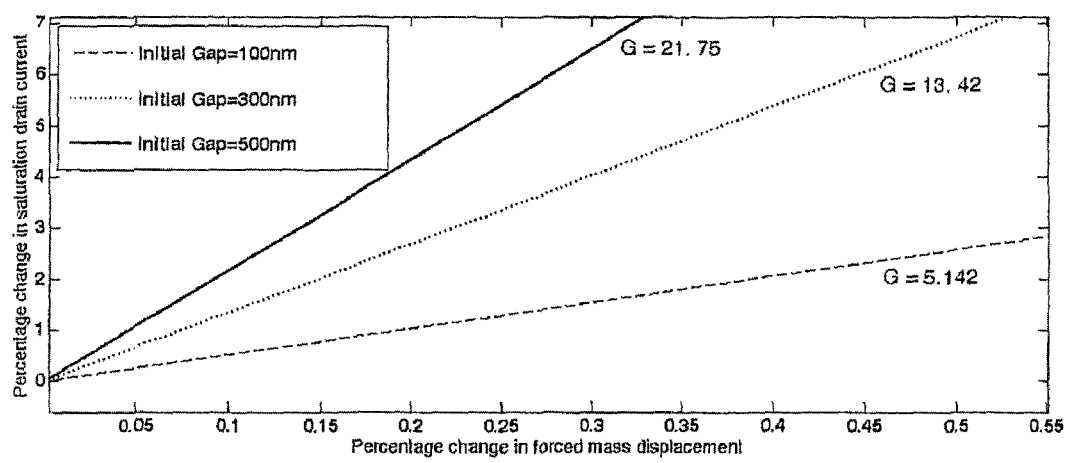
FIG. 3 shows graph of sensitivity of the device when operated in saturation regime

If the proposed device were to be biased in the saturation region, the sensing gain would have been much lower as illustrated in FIG. 3.

The proposed structure has several design parameters such as $N_A$, $T_{Si}$, $T_{Gap}$, $T_{Ox}$ and $T_{Box}$, which is optimized to meet a given sensor specification. Although the proposed solution has been discussed considering the applications in accelerometers, gyroscopes and vibrometers the solution is applied to sense any small deflection measurements. The proposed structure here has been described with Silicon substrate, in principle it is implemented using other semi-conducting substrates as well.

Coupling the force sensor proof mass to act as gate of the MOSFET (forced mass) is realized using a CMOS-MEMS process. The realization manifests as a significant integration step in avoiding extraneous noise or parasitics, which is a major concern in highly sensitive capacitance detection circuits. The sensitivity of the device is affected by the temperature effects alone and not by any external parasitics as in the case of capacitance detection circuits [4]. The temperature compensation is easily achieved by constructing a conventional MOSFET operated in sub-threshold region, in the neighborhood of FET.

References

[1] R. L. Kubena, D. J. Vickers-Kirby, "A new tunneling-based sensor for inertial rotation rate measurements", Sensors and Actuators 83 (2000) 109-117

[2] Hopkin, "Performance and design of a silicon micromachined gyroscope", Proc. Symp. Gyro Technology, pp. 1.0-1.11, Stuttgart, Germany, 1997.

[3] Kraft, M. and Evans, "A System level simulation of an electrostatically levitated disk". Proc. 3rd Conf. on Modeling and Simulation of Microsystems, pp. 130-133, San Diego, March 2000.

[4] Joost C. Lotters, Wouter Olthuis, "A Sensitive Differential Capacitance to Voltage Converter for Sensor Applications", IEEE transactions on instrumentation and measurement, vol 48, no. 1, February 1999

[5] Said Emre Alper, Kivanc Azgin, Tayfun Akin, "A High-performance Silicon-On-Insulator MEMS gyroscope operating at atmospheric pressure", Sensors and Actuators A 135 (2007) 34-42

[6] Xiadong Wang and P. K. Ajmera, "Laterally movable gate field effect transistors for microsensors and microactuators," US 2001, 6,204,544

[7] Farrokh Ayazi, Mohammad Faisal Zaman, "High resolution in-plane tuning fork gyroscope and methods of fabrication", US 2006/7,043,985 B2

[8] Paul ward, Walthm, Mass, "Electronics for coriolis force and other sensors", US 1997/5,600,064A

We claim:

1. A Sub-threshold Forced plate FET (SF-FET) sensor for sensing inertial displacements comprises:
   a. forced mass forming a suspended gate of the sensor,
   b. fixed dielectric medium on substrate of the FET, and
   c. a second dielectric medium formed between the forced mass and the fixed dielectric, wherein the inertial displacements deflects suspended forced mass of the sensor resulting in change in gap height ($T_{Gap}$) of the second dielectric which in turn varies sensor gate capacitance.

2. The sensor as claimed in claim 1, wherein the fixed dielectric is preferably silicon-dioxide ($SiO_2$) formed on top of FET channel.

3. The sensor as claimed in claim 1 wherein the fixed dielectric is selected from a group of dielectric materials comprising Silicon dioxide (SiO$_2$), high-K material and other dielectric material to act as a passivating layer for the substrate under choice.

4. The sensor as claimed in claim 1, wherein the forced plate is proof mass of MEMS/NEMS transducer.

5. The sensor as claimed in claim 1, wherein said second dielectric medium allows forced plate to exhibit at least a single degree of freedom motion to constitute the SF-FET.

6. The sensor as claimed in claim 1, wherein the forced plate realm extends beyond and spans whole category of any rigid plate design.

7. The sensor as claimed in claim 1, wherein the forced mass is displaced by inertial displacements altering the gap height ($T_{Gap}$) of the second dielectric, wherein linear change in forced mass displacement results in an exponential change in drain current ($I_D$) of the sensor.

8. The sensor as claimed in claim 1, wherein the gap height ($T_{Gap}$) of second dielectric is optimized for predetermined thickness of silicon dioxide layer ($T_{ox}$) and predetermined thickness of silicon substrate layer ($T_{Si}$) for enhanced capacitive coupling and to obtain low threshold voltage requirements.

9. The sensor as claimed in claim 1, wherein the sensor is built on a Silicon-On-Insulator (SOI) substrate comprising of a thin film of Silicon (Si) resting on an oxide layer which is buried in the Silicon (Si) substrate.

10. The sensor as claimed in claim 1, wherein the substrate is selected from a group of semi-conducting material comprising Germanium, Silicon (Si) and Gallium arsenide (GaAs).

11. The sensor as claimed in claim 1, wherein the sensor is integrated into a standard CMOS-MEMS process flow on a single silicon substrate.

12. The sensor as claimed in claim 1, wherein said sensor has feed back control loop for maintaining constant drain current ($I_D$), enhancing the dynamic range of the SF-FET and for maintaining uniform sensitivity over a wide range of operations.

13. The sensor as claimed in claim 1, wherein the sensor is implemented with poly-silicon gate and diffused source-drain junctions or with metal gates and schotky source-drain junctions or any combinations thereof.

14. The sensor as claimed in claim 1, wherein the SF-FET is operated in fully depleted SOI (Silicon on Insulator) mode and sub-threshold slope of the SF-FET is enhanced due to fully depleted SOI architecture, which further improves overall sensitivity of the SF-FET.

15. The sensor as claimed in claim 14, wherein the fully depleted SOI mode is configured to give predetermined sensitivity, SF-FET is also implemented in Partially Depleted SOI (PDSOI), Dynamically Depleted SOI (DDSOI), bulk MOSFET or other similar device structure.

16. The sensor as claimed in claim 1, wherein the sensor has predetermined amplification factor which is obtained by biasing the SF-FET in the sub-threshold regime and enables amplification of displacements of the order of nano/pico meter, due to the forced plate motion.

17. The sensor as claimed in claim 1, wherein the forced mass is subjected to angular rigid body motion.

18. The sensor as claimed in claim 17, wherein the forced mass is realized using a plate or rod pivoted at the center.

19. A method to sense inertial displacements using Sub-threshold Forced plate FET (SF-FET) sensor comprises act of observing change in drain current ($I_D$) of the sensor due to change in gap height ($T_{Gap}$) of the second dielectric of the sensor caused by deflection of suspended forced mass for sensing the inertial displacements.

20. The method as claimed in claim 19, wherein said sensor is operated by applying constant gate-to-source voltage ($V_{GS}$), which is less than threshold voltage ($V_T$) of the FET.

21. The method as claimed in claims 19 or 20, wherein the change in the gap height ($T_{Gap}$) of the second dielectric results in change in sensor gate capacitance.

22. The method as claimed in claim 21, wherein the change in sensor gate capacitance results in exponential change in the drain current ($I_D$).

23. The method as claimed in claim 19, wherein the inertial displacements are generated from vibrometers, accelerometers, gyroscopes, chemical vapor sensors and other forced plate motion which is a candidate for small deflection measurement.

24. A system for sensing deflections due to forced displacement comprising:
   a. a forced mass or plate forming a suspended gate of the sensor, fixed dielectric on substrate of the FET, and a second dielectric formed between the forced mass and the fixed dielectric, wherein the inertial displacements deflects suspended forced mass of the sensor resulting in change in gap height ($T_{Gap}$) of second dielectric which in turn varies the sensor gate capacitance,
   b. a means to operate the sensor at sub-threshold region by applying constant gate-to-source voltage ($V_{GS}$), wherein the voltage ($V_{GS}$) is less than the threshold voltage ($V_T$) of the sensor, and
   c. a means to sense the exponential change in drain current ($I_D$) due to the variation in sensor gate capacitance for sensing the deflection.

* * * * *